(12) United States Patent
Wang

(10) Patent No.: US 9,247,665 B2
(45) Date of Patent: Jan. 26, 2016

(54) UNINTERRUPTIBLE POWER SUPPLY WITH A POWER ISOLATION CIRCUIT LOOP

(71) Applicant: Cyber Power Systems Inc., Taipei (TW)

(72) Inventor: Jian Wang, Taipei (TW)

(73) Assignee: Cyber Power Systems, Inc., Taipei (TW)

( * ) Notice: Subject to any disclaimer, the term of this patent is extended or adjusted under 35 U.S.C. 154(b) by 410 days.

(21) Appl. No.: 13/923,712

(22) Filed: Jun. 21, 2013

(65) Prior Publication Data

US 2014/0375142 A1 Dec. 25, 2014

(51) Int. Cl.
*H05K 7/14* (2006.01)
*H05K 7/18* (2006.01)
*H05K 7/02* (2006.01)

(52) U.S. Cl.
CPC ............... *H05K 7/02* (2013.01); *H05K 7/1432* (2013.01); *Y10T 307/74* (2015.04); *Y10T 307/747* (2015.04)

(58) Field of Classification Search
USPC ......... 361/728–730, 752, 796, 800, 801, 802, 361/759; 455/575.1–575.4, 575.7; 307/112–113
See application file for complete search history.

(56) References Cited

U.S. PATENT DOCUMENTS

| 4,129,743 | A  | * | 12/1978 | Lohsl .............................. 174/38 |
| 6,940,711 | B2 | * | 9/2005  | Heuell et al. .................. 361/668 |
| 7,158,382 | B2 | * | 1/2007  | Fan et al. ...................... 361/715 |
| 8,247,109 | B2 | * | 8/2012  | Zuo et al. ...................... 429/163 |
| 2006/0094276 | A1 | * | 5/2006 | Till et al. ...................... 439/327 |
| 2007/0050981 | A1 | * | 3/2007 | Freund et al. .................. 30/41.7 |

* cited by examiner

*Primary Examiner* — Hung S Bui
(74) *Attorney, Agent, or Firm* — C. G. Mersereau; Nikolai & Mersereau, P.A.

(57) ABSTRACT

An interruptible power supply with a power isolation circuit loop has a base with a battery chamber defined in the base, a fixed top cover, and a movable top cover. The battery chamber serves to receive a battery. The fixed top cover and the movable top cover are mounted on two ends of the base, and the movable top cover corresponds to the battery chamber. The fixed top cover has a loop switch therein connected with a power loop and having an actuation member to switch on or off the power loop. When the movable top cover is mounted on the base, an urging member formed on the movable top cover triggers the actuation member of the loop switch to connect with the power loop. When the movable top cover is removed, the power loop is disconnected. Accordingly, the UPS is economical in terms of parts, cost and space utilization.

8 Claims, 5 Drawing Sheets

UNINTERRUPTIBLE POWER SUPPLY WITH A POWER ISOLATION CIRCUIT LOOP

BACKGROUND OF THE INVENTION

1. Field of the Invention

The present invention relates to an uninterruptible power supply (UPS), and more particularly to a UPS with a power isolation circuit loop.

2. Description of the Related Art

Conventional UPSs in the market are connected to electric/electronic appliances and mainly serve to supply power during power outage. Certain UPSs also provide functions for irregular power prevention and noise immunity to protect electric/electronic equipment, especially for precision instruments requiring higher power quality. By and large, UPS is not major equipment to users unless users have a demand for higher power quality.

Taiwan Power Company announces that the average power outage time per power consumer in the science parks islandwide is 1.2 minute (about 72 seconds) in 2010. Such power supply performance can be ranked high in terms of power supply quality because those power consumers in the science parks are densely concentrate and mostly pertain to electronic, semiconductor, communication and photonics industries, which usually suffer heavy loss upon power outage.

Besides the production lines of manufacturers in the science parks, regular users also require UPS in their daily life. The commonly used UPSs are UPSs with replaceable batteries, and the circuit design of the UPSs is to design a circuit on a battery side as an isolation circuit for effectively isolating power coming from electric/electronic appliances connected to the UPSs, thereby protecting power users from the risk of high-voltage shock during battery replacement. However, additional isolated power source, optical coupler, isolated detection circuit, and the like are needed between a primary-side circuit and a secondary-side circuit, and the element cost and the challenge to internal space utilization are relatively higher. In addition, the disadvantages in terms of complicated circuits, more isolated elements, high UPS cost, and larger size of circuit board inside the UPSs also exist.

SUMMARY OF THE INVENTION

An objective of the present invention is to provide a UPS with a power isolation circuit loop simplifying isolation circuit, reducing isolation parts and cost, and saving internal space utilization.

To achieve the foregoing objective, the UPS with a power isolation circuit loop has a base, a fixed top cover, and a movable top cover.

The base has two opposite ends, a PCBA chamber, a battery chamber, and two electrodes.

The PCBA chamber is defined in the base.

The battery chamber is defined in the base for receiving a battery connected to a power loop.

The fixed top cover is securely mounted on one of the opposite ends of the base to correspond to the PCBA chamber, and having a loop switch. The loop switch is mounted on an inner wall of the fixed top cover, is connected to the power loop inside the battery chamber, and has an actuation member for switching on or off the power loop.

The movable top cover is detachably mounted on the other opposite end of the base to correspond to the battery chamber, and has an urging member formed on an inner edge portion of the movable top cover to correspond to the actuation member of the loop switch.

When the movable top cover of the UPS is mounted on the base and connected with the fixed top cover, the urging member of the movable top cover presses the actuation member of the fixed top cover to connect to a power loop. When the movable top cover is removed for battery replacement, the movable top cover disengages from the fixed top cover, and the urging member no longer presses the actuation member so that the power loop of the UPS is disconnected. Accordingly, such structure allows simplification of the isolation circuit, reduces required isolation elements and cost, and saves internal space utilization of the UPS.

Other objectives, advantages and novel features of the invention will become more apparent from the following detailed description when taken in conjunction with the accompanying drawings.

DETAILED DESCRIPTION OF THE INVENTION

Figure 1:
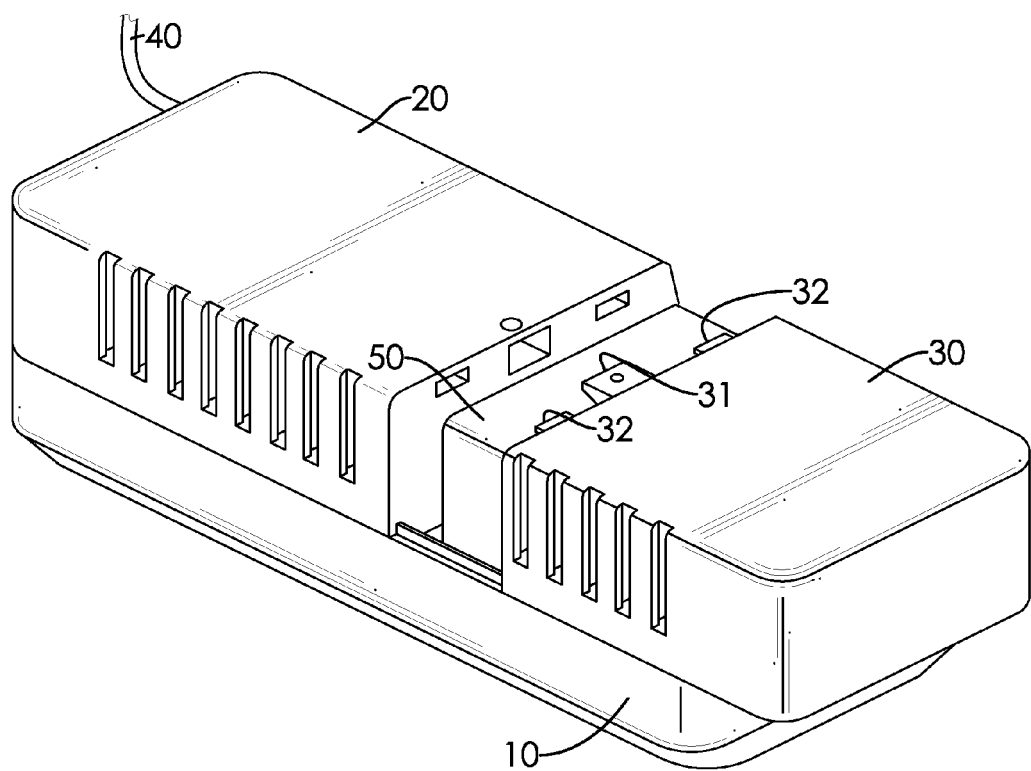
FIG. 1 is a perspective view of a UPS with a power isolation circuit loop in accordance with the present invention.

With reference to FIG. 1, a UPS with a power isolation circuit loop in accordance with the present invention has a base 10, a fixed top cover 20, and a movable top cover 30. The base 10 has two opposite ends. The fixed top cover 20 and the movable top cover 30 are side-connected and engageable with each other.

In the present embodiment, the UPS further has a battery 50 and a power connection cable 40. The battery 50 is mounted inside the UPS. The power connection cable 40 is connected with an outer portion of the fixed top cover 20, and has two ends. One end of the power connection cable 40 is electrically connected to an electric appliance, and the other end is electrically connected to the UPS. The base 10 has a printed circuit board assembly (PCBA) chamber, a battery chamber, and two electrodes. The PCBA chamber is defined in the base 10. The battery chamber is defined in the base 10 for receiving the battery 50. The two electrodes are mounted on an inner wall of the battery chamber for electrically connecting with the battery 50 to provide a power loop.

Figure 2:
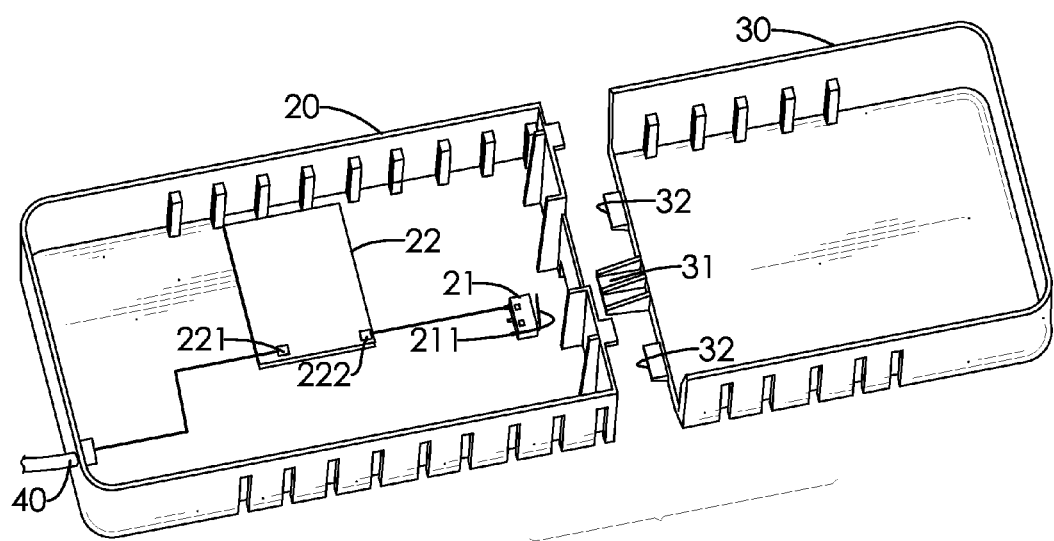
FIG. 2 is a partially exploded perspective view of the UPS in FIG. 1.

With reference to FIG. 2, the internal structures of the fixed top cover 20 and the movable top cover 30 of the UPS in FIG. 1 are shown. The fixed top cover 20 is securely mounted on one of the two opposite ends of the base 10 to correspond to the PCBA chamber, and has a loop switch 21 and a circuit board 22. The loop switch 21 is mounted on an inner wall of the fixed top cover 20, is connected to the power loop inside the battery chamber, and has an actuation member 211 for switching on or off the power loop. The circuit board 22 is mounted on the inner wall of the fixed top cover 20, and has a first power contact 221 and a second power contact 222. The first power contact 221 is formed on the circuit board 22 and is electrically connected to the power connection cable 40. The second power contact 222 is formed on the circuit board 22 and is electrically connected to the loop switch 21.

The movable top cover 30 is detachably mounted on the other opposite end of the base 10 to correspond to the battery chamber, and has an urging member 31 formed on an inner edge portion of the movable top cover 30 to correspond to the actuation member 211 of the loop switch 21. When the fixed top cover 20 and the movable top cover 30 are connected with each other, the urging member 31 triggers the actuation member 211, and the loop switch is in an ON state so that the UPS can normally operate.

In the present embodiment, the movable top cover 30 has two rectangular inserts 32 formed on the inner edge portion of the movable top cover 30 and located on the left and right sides of the urging member 31, and being smaller than the urging member 31. The fixed top cover 20 further has an opening and two fixing slots. The opening is formed through an inner edge portion of the fixed top cover 20 to correspond to the loop switch 21. The fixing slots are formed in the inner edge portion and located on the left and right sides of the opening to respectively correspond to the two rectangular inserts 32. When the movable top cover 30 is mounted on the base 10, the urging member 31 engages the opening and the rectangular inserts 32 respectively engage the fixing slots of the fixed top cover for the fixed top cover 20 and the movable top cover 30 to be firmly combined.

With reference to FIGS. 1 and 2, when the fixed top cover 20 and the movable top cover 30 are connected, the urging member 31 stays in a state of constantly pressing the actuation member 211. The fixed top cover 20 is securely connected with the movable top cover 30 by respectively inserting both rectangular inserts 32 into the fixing slots of the fixed top cover 20. To replace the battery 50 of the UPS, the movable top cover 30 is detached by disengaging the rectangular inserts from the fixing slots so that the urging member 31 does not press the actuation member 211 and the loop switch 21 is switched to an OFF state.

The loop switch 21 is further collaborated with an isolated protection circuit formed on the circuit board 22 to fully isolate the electric appliance during battery replacement.

Figure 3:
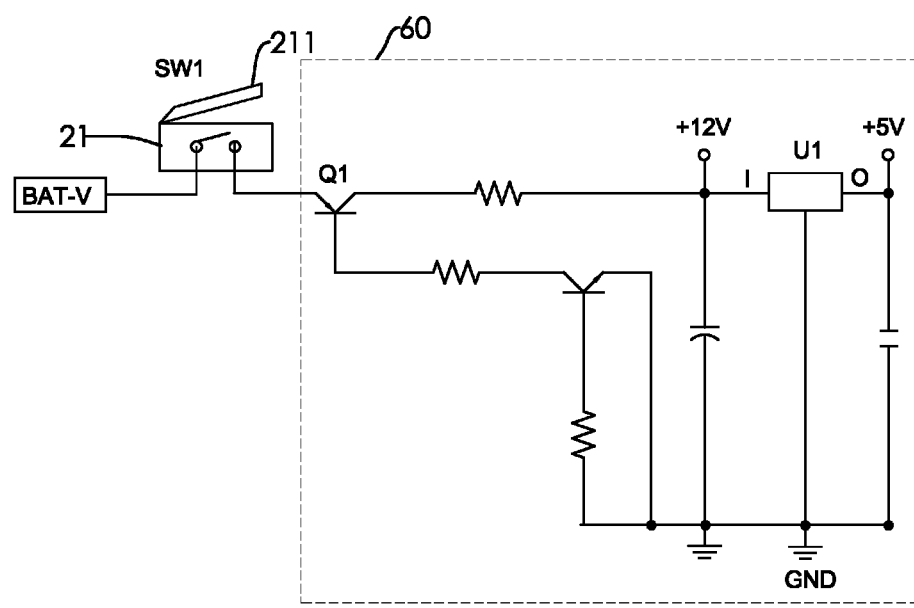
FIG. 3 is a circuit diagram of a first embodiment of an isolated protection circuit of the UPS in FIG. 1.

With reference to FIG. 3, a first embodiment of an isolated protection circuit of the UPS has a power control circuit 60 formed on the circuit board 22 and connected to a power source. The loop switch 21 is connected between the power control circuit 60 and a circuit loop BAT-V inside the battery chamber. The power control circuit 60 has an electronic switch Q1 and a voltage regulator U1. The voltage regulator U1 has a voltage input terminal and a voltage output terminal. The electronic switch Q1 has an input terminal and an output terminal. The input terminal is connected to the loop switch 21. The output terminal is connected to the voltage input terminal of the voltage regulator U1. The electronic switch Q1 acquires a 12V DC power from the loop switch 21, and supplies the 12V DC power through the output terminal of the electronic switch Q1. The voltage regulator U regulates the 12V DC power and supplies a 5V DC power through the voltage output terminal thereof. Thus, DC power with different voltages can be supplied. To replace the battery 50, the movable top cover 30 is removed from the base 10 so that the urging member 31 no longer presses the actuation member 211. Meanwhile, when the loop switch 21 is switched to an OFF state, the loop switch 21 disconnects the circuit loop BAT-V inside the battery chamber from the power control circuit 60. Hence, stopping power output and disconnecting from power loop can be implemented to achieve the goal of safe isolation of power loop.

Figure 4:
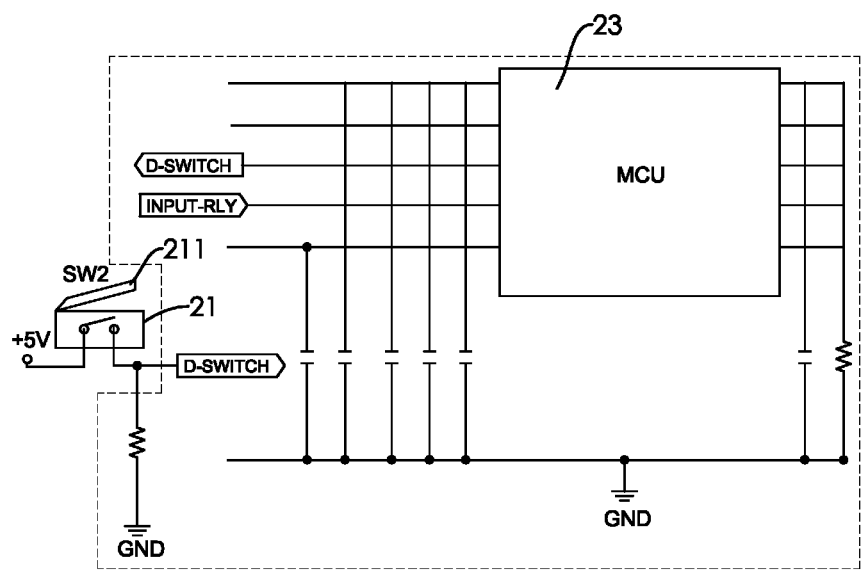
FIG. 4 is a partial circuit diagram of a second embodiment of an isolated protection circuit of the UPS in FIG. 1.
Figure 5:
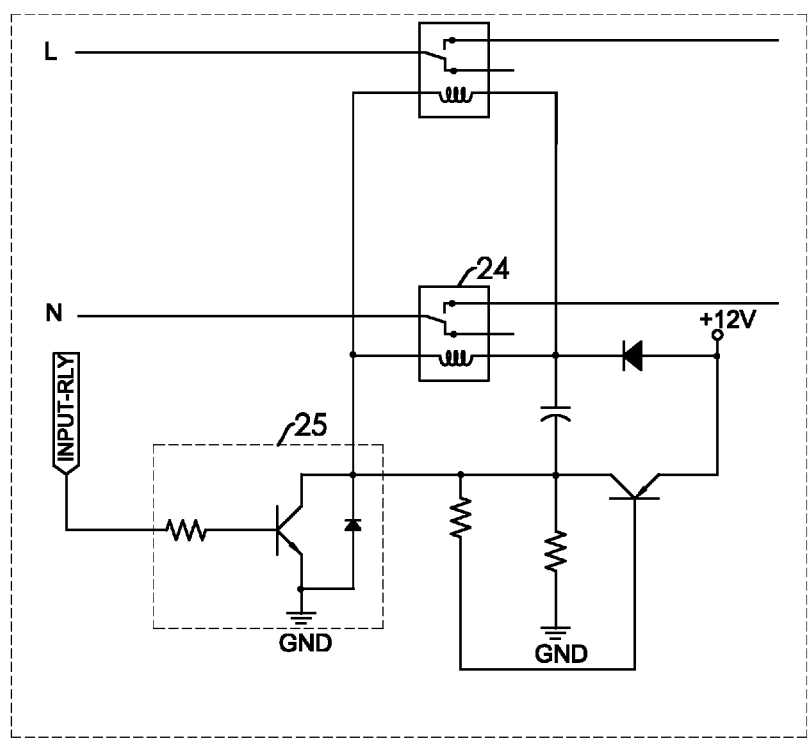
FIG. 5 is another partial circuit diagram of the second embodiment of an isolated protection circuit of the UPS in FIG. 1.

With reference to FIGS. 4 and 5, a second embodiment of an isolated protection circuit of the UPS has a microcontroller unit (MCU) 23, a relay 24 and a switching circuit 25. The switching circuit 25 has a control terminal and an input terminal. The relay 24 is formed by a normally closed switch and an excitation coil. The excitation coil is connected between a 12V input power source and the input terminal of the switching circuit 25 for controlling a switching state of the normally closed switch. The MCU 23 has multiple pins. One of the pins D-SWITCH is electronically connected to the loop switch 21. Another pin INPUT-RLY is electronically connected to the control terminal of the switching circuit 25. The loop switch 21 is connected to a 5V DC power source. When the movable top cover 30 is mounted on the base 10, the loop switch 21 is switched on to provide a 5V voltage to a pin D-SWITCH of the MCU 23. Under this circumstance, a pin INPUT-RLY of the MCU 23 does not output a signal to drive the switching circuit 25. Hence, the normally closed switch of the relay 24 remains at a closed state. After the battery 50 is replaced and the movable top cover 30 is removed, the loop switch 21 is switched off. The potential of the pin D-SWITCH of the MCU 23 is changed, and the pin INPUT-RLY of the MCU 23 outputs a signal to drive the switching circuit 25 so that the relay 24 is switched to an open state. The MCU 23 outputs another signal to shut down the power output of the UPS and the goal of safe isolation of power loop can be achieved.

Given the foregoing means, the power loop of the UPS can be disconnected and the battery can be isolated from the electric appliance to fulfill the goal of less isolation element and cost required.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A uninterruptible power supply (UPS) with a power isolation circuit loop, comprising:
    a base having:
        two opposite ends;
        a printed circuit board assembly (PCBA) chamber defined in the base;
        a battery chamber defined in the base for receiving a battery connected to a power loop;
    a fixed top cover securely mounted on one of the opposite ends of the base, and having a loop switch, wherein the loop switch is mounted on an inner wall of the fixed top cover, is connected to the power loop inside the battery chamber, and has an actuation member for switching on or off the power loop; and
    a movable top cover detachably mounted on the other opposite end of the base to correspond to the battery chamber, and having an urging member formed on an inner edge portion of the movable top cover to correspond to the actuation member of the loop switch.

2. The UPS as claimed in claim 1, wherein the fixed top cover further has a power connection cable, one end of the power connection cable is adapted to electrically connect to an electric appliance, and the other end of the power connection cable is electrically connected to the UPS.

3. The UPS as claimed in claim 2, wherein
    the fixed top cover further has a circuit board mounted on the inner wall of the fixed top cover, and the circuit board has:
    a first power contact formed on the circuit board and electrically connected to the power connection cable; and a second power contact formed on the circuit board and electrically connected to the loop switch; and the loop switch is mounted on the circuit board.

4. The UPS as claimed in claim 3, wherein the fixed top cover further has an opening formed through an inner edge portion of the fixed top cover to correspond to the loop switch.

5. The UPS as claimed in claim 4, wherein the movable top cover further has two rectangular inserts formed on the inner edge portion of the movable top cover and located on the left and right sides of the urging member, and being smaller than the urging member;

the fixed top cover further has two fixing slots formed in the inner edge portion of the fixed top cover and located on both sides of the opening to respectively correspond to the two rectangular inserts.

6. The UPS as claimed in claim 5, wherein the circuit board has a power control circuit formed on the circuit board and adapted to connect to a power source; and the loop switch is connected between the power control circuit and a circuit loop inside the battery chamber.

7. The UPS as claimed in claim 6, wherein the power control circuit has:

a voltage regulator having a voltage input terminal and a voltage output terminal; and an electronic switch having:
an input terminal connected to the loop switch; and
an output terminal connected to the voltage input terminal of the voltage regulator.

8. The UPS as claimed in claim 5, wherein the circuit board further has:

a switching circuit having:
a control terminal; and
an input terminal;

a microcontroller unit (MCU) having multiple pins, wherein one of the pins is electronically connected to the loop switch, and another pin is electronically connected to the control terminal of the switching circuit; and a relay having:
a normally closed switch; and
an excitation coil connected between an input power source and the input terminal of the switching circuit for controlling a switching state of the normally closed switch.

\* \* \* \* \*